(12) United States Patent
Endo et al.

(10) Patent No.: US 6,461,745 B2
(45) Date of Patent: Oct. 8, 2002

(54) COPPER FOIL FOR TAPE CARRIER AND TAB CARRIER TAPE AND TAB TAPE CARRIER USING THE COPPER FOIL

(75) Inventors: Ayumi Endo, Shimodate; Kojiro Noda, Hitachiota, both of (JP)

(73) Assignee: Nippon Denkai, Ltd., Tokyo (JP)

( * ) Notice: Subject to any disclaimer, the term of this patent is extended or adjusted under 35 U.S.C. 154(b) by 0 days.

(21) Appl. No.: 09/829,045

(22) Filed: Apr. 10, 2001

(65) Prior Publication Data

US 2001/0049027 A1 Dec. 6, 2001

(30) Foreign Application Priority Data

Apr. 25, 2000 (JP) ......................................... 2000-124636

(51) Int. Cl.⁷ .......................... B32B 15/00; B32B 15/08; B32B 15/20; H01B 7/00
(52) U.S. Cl. ........................ 428/626; 428/674; 428/675; 428/457; 428/473.5; 438/584; 438/652; 174/110 R; 174/126.1
(58) Field of Search .................................. 428/615, 626, 428/663, 666, 667, 668, 671, 674, 675, 678, 687, 343, 344, 457, 473.5; 438/584, 652; 174/110 R, 113 R, 126.1, 126.4

(56) References Cited

U.S. PATENT DOCUMENTS 5,622,782 A * 4/1997 Poutasse et al. ............ 428/344
5,709,957 A * 1/1998 Chiang et al. ............... 428/615
5,990,553 A * 11/1999 Morita et al. ................ 257/729

FOREIGN PATENT DOCUMENTS

| JP | 6-13749 | * | 1/1994 |
| JP | 6-013749 | * | 1/1994 |
| JP | 6-206279 | * | 7/1994 |
| JP | 08-309918 | | 11/1996 |
| JP | 11-087401 | * | 3/1999 |

* cited by examiner

Primary Examiner—Deborah Jones
Assistant Examiner—Michael LaVilla
(74) Attorney, Agent, or Firm—Antonelli, Terry, Stout & Kraus, LLP

(57) ABSTRACT

A copper foil for a TAB tape carrier, comprising (a) a copper foil having a shiny surface and a mat surface; and (b) an alloy layer comprising nickel, cobalt and molybdenum, which is formed at least on the shiny surface; a TAB carrier tape, comprising a flexible insulating film and the copper foil for a TAB tape carrier applied onto the flexible insulating film with a surface on the side of the mat surface facing the flexible insulating film; and a TAB tape carrier, which is produced from the TAB carrier tape by etching the copper foil for a TAB tape carrier to form a copper lead pattern.

12 Claims, No Drawings

COPPER FOIL FOR TAPE CARRIER AND TAB CARRIER TAPE AND TAB TAPE CARRIER USING THE COPPER FOIL

BACKGROUND OF THE INVENTION (a) Field of the Invention

The present invention relates to a copper foil to be used for the production of TAB (Tape Automated Bonding) tape carriers and a TAB carrier tape and a TAB tape carrier both using the copper foil. Particularly, it relates to a copper foil for TAB tape carriers, which effectively prevents the generation of Sn whiskers and Kirkendall voids, and a TAB carrier tape and a TAB tape carrier using the copper foil.

(b) Description of the Related Art

To automate and speed up the mounting of semiconductor elements, there have been extensively used the TAB technique wherein a semiconductor element, such as IC or LSI, is mounted by wireless-bonding on a tape carrier, which is a lengthy, flexible insulating film bearing copper lead patterns.

Being excellent in corrosion resistance and soldering capability, Sn-plating film has recently been formed on copper lead patterns in substitution for Au-plating film. The Sn-plating film, however, is known to generate with passage of time Sn whiskers, which are beardlike, needle-like crystals. The growth of Sn whiskers causes short circuit. To prevent this, after Sn-plating, heating treatment for 1 to 2 hours at 100 to 150° C. has been required. The heating, however, causes rapid counter diffusion between the Sn-plating film and Cu of copper foil, and, because Cu atoms diffuse faster than Sn atoms, voids, what are called Kirkendall voids, are made on the side of the copper foil contacting the Sn-plating film. This lowers the adhesion of the Sn-plating film, causing peeling on soldering.

As the pitch of copper lead patterns has recently been made finer, prevention of the generation of Sn whiskers and Kirkendall voids has become an important object to be achieved promptly.

There have been taken various measures to prevent the generation of Sn whiskers and Kirkendall voids. For example, a means proposed to prevent the generation of Sn whiskers is the use of a tin plating bath to which indium and a salt of a low-melting metal, such as lead, bismuth or antimony, are added in such an amount as to form a deposit film containing 0.1 to 3.0% by weight of the low-melting metal. It is also proposed to plate as a backing for the tin-plating film a metal other than tin, such as backing solder-plating or backing nickel-copper two-layer plating.

To prevent the generation of Kirkendall voids, it is proposed to inhibit the counter diffusion of Cu and Sn by forming a Zn layer or a copper alloy layer containing at least 10 % by weight of Zn at the parts for bonding with solder.

These methods, however, involve the problems that (1) a step is added prior to Sn-plating, thereby increasing the production cost and lowering productivity and (2) copper foil itself cannot be improved.

SUMMARY OF THE INVENTION

An object of the present invention is to provide a highly reliable copper foil for TAB tape carriers, which effectively prevents the generation of Sn whiskers and Kirkendall voids without requiring any addition or change of steps after the formation of copper lead patterns, and to provide a TAB carrier tape and a TAB tape carrier both using the copper foil.

Another object of the present invention is to provide a copper foil for TAB tape carrier, which maintains good properties necessary for forming copper leads, including heat resistance and solder wettability.

As the result of study for achieving the objects, we have found that the generation of Sn whiskers on the Sn plating film formed on patterned copper leads and the generation of Kirkendall voids due to the counter diffusion of Cu and Sn can be outstandingly prevented by using as a copper foil for TAB tape carriers a copper foil having on its shiny surface (S-surface) an alloy layer comprising nickel, cobalt and molybdenum (nickel-cobalt-molybdenum layer), and have made the present invention based on the finding.

The present invention provides a copper foil for TAB tape carriers, comprising (a) a copper foil having a shiny surface and a mat surface; and (b) an alloy layer comprising nickel, cobalt and molybdenum (nickel-cobalt-molybdenum layer), which is formed at least on the shiny surface.

The present invention further provides a TAB carrier tape, which comprises a flexible insulating film and the above-described copper foil for TAB tape carriers applied onto the flexible insulating film, with a surface on the side of the mat surface contacting the flexible insulating film.

The present invention further provides a TAB tape carrier, which is produced from the above-described TAB carrier tape by etching the copper foil for TAB tape carriers to form a copper lead pattern.

DESCRIPTION OF THE PREFERRED EMBODIMENTS

The copper foil for TAB tape carriers of this invention is characterized in having on at least the shiny surface (S-surface) of a copper foil an alloy layer comprising nickel, cobalt and molybdenum (nickel-cobalt-molybdenum layer). The nickel-cobalt-molybdenum layer formed on the copper foil is a thin alloy layer comprising metallic nickel, cobalt and molybdenum as main components, and is firmly adhering to the surface of the underlying copper foil. Near the surface of the nickel-cobalt-molybdenum layer, nickel and oxides and hydroxides of cobalt and molybdenum may be mixed in. The copper foil having the nickel-cobalt-molybdenum layer generates less Sn whiskers and less Kirkendall voids after Sn-plating following to the formation of copper lead patterns, thereby preventing short circuit and solder peeling, and also maintains good properties necessary for forming the copper leads, including etching capability, heat resistance and solder wettability.

As to the coating amounts and ratios of nickel, cobalt and molybdenum constructing the nickel-cobalt-molybdenum layer as measured as metals, the coating amount of each of nickel, cobalt and molybdenum is preferably 30 to 1,000 $\mu g/dm^2$. If they are less than 30 $\mu g/dm^2$ respectively, the layer may be too thin to prevent the generation of Sn whiskers and Kirkendall voids sufficiently, and if more than 1,000 $\mu g/dm^2$, the generation of Sn whiskers and Kirkendall voids will be prevented sufficiently, but the etching capability for forming copper lead patterns may be adversely affected depending on the ratios among them. Each coating amount is particularly preferably 50 to 500 $\mu g/dm^2$.

In the present invention, electrolytic copper foil having a shiny surface (S-surface) and a mat surface (M-surface) is generally used as the starting copper foil. The copper foil may have any thickness of copper foil commonly used for TAB tape carriers, preferably 3 to 70 $\mu m$, more preferably 5 to 18 $\mu m$.

The surface roughness Ra of the S-surface of the copper foil is preferably 0.1 to 0.5 μm, and that of the M-surface is preferably 0.2 to 0.7 μm. Of course, the M-surface is rougher than the S-surface. To form fine copper lead patterns, the copper foil used in the present invention preferably has an M-surface with a surface roughness smaller than that of common copper foil. Further preferred surface roughness Ra of the M-surface is 0.2 to 0.4 μm. To produce TAB tape carriers having good handling quality, the copper foil to be used in the present invention preferably has a large tensile strength, particularly a tensile strength of 400 to 700 N/mm². To give high peeling strength after lamination between the M-surface of the copper foil and a flexible insulating film, such as a polyimide film or a polyester film, to be bonded to the M-surface, the copper foil to be used preferably has a surface roughening treatment layer formed by subjecting the M-surface to surface roughening treatment. The surface roughening treatment may be performed, for example, by carrying out cathodic electrolysis treatment using a plating bath containing copper ions and nickel ions to form a finely granular roughened surface.

The means for producing the copper foil of the present invention by forming a nickel-cobalt-molybdenum layer on a copper foil may be known one, such as electroplating, chemical plating, vacuum deposition or spattering. In view of mass productivity and good economy, practically preferred among these is cathodic electrolysis treatment using electroplating. In cases where electroplating is used, a copper foil is subjected to a cathodic electrolysis treatment in a plating bath containing nickel ions, cobalt ions and molybdic acid ions, to form a nickel-cobalt-molybdenum layer on the S-surface of the copper foil.

The plating bath to be used for the cathodic electrolysis treatment for forming the nickel-cobalt-molybdenum layer contains metal ions comprising nickel ions, cobalt ions and molybdic acid ions. Preferred examples of nickel ion sources include $NiSO_4$, $NiCl_2$, $NiCO_3$ and hydrates thereof. Preferred examples of cobalt ion sources include $CoSO_4$, $CoCl_2$ and hydrates thereof. Preferred examples of molybdic acid ion sources include $Na_2MoO_4$, $(NH_4)_6Mo_7O_{24}$, $K_2MoO_4$ and hydrates thereof.

At least one nickel ion source, at least one cobalt ion source and at least one molybdic acid ion source are dissolved in water to prepare a plating bath. Preferred contents of the metal ions in the plating bath depend on the above-described coating amounts of the metals, current density and electrolyzing period, and are generally 0.1 to 50 g/l, preferably 5.0 to 40 g/l respectively. In cases where $NiSO_4 \cdot 6H_2O$ as the nickel ion source, $CoSO_4 \cdot 7H_2O$ as the cobalt ion source and $Na_2MoO_4 \cdot 2H_2O$ as the molybdic acid ion source are used, their contents are particularly preferably 2.0 to 40 g/l respectively.

The pH of the plating bath may be adjusted within a wide range including acidic values and alkaline values, and an acidic plating bath is generally preferable. The pH is preferably 4.0 to 6.0. Further, complexing agents, such as sulfamic acid, may be added to prevent the precipitation of the metal ions in the plating bath. Salts, such as sodium sulfate and ammonium chloride, may also be added to the plating bath to increase its conductivity. The temperature of the plating bath may generally be room temperature.

A nickel-cobalt-molybdenum layer is formed on the S-surface of copper foil by dipping the copper foil in the plating bath, with a non-soluble anode facing to the S-surface of the copper foil, and applying an electric current. Although the applicable current density and the electrolyzing period cannot be specified because they depend on other conditions including the above-described amounts of the metal ions and the coating amounts and ratios of the plating metals, preferred current density is generally 0.1 to 10 A/dm², more preferably 0.2 to 2.0 A/dm², and preferred electrolyzing period is generally 1 to 60 seconds, more preferably 1 to 30 seconds.

The nickel-cobalt-molybdenum layer may also be formed on each of the S-surface and the M-surface by subjecting the M-surface to the same cathodic electrolysis treatment.

After the copper foil is coated by the nickel-cobalt-molybdenum layer as described above, a chromate treatment layer may optionally be formed on the surface on the side of the M-surface of copper foil or each side, to improve rust resistance and chemical resistance. Further, the copper foil having the nickel-cobalt-molybdenum layer or having both the nickel-cobalt-molybdenum layer and the chromate treatment layer may further has a silane coupling agent treatment layer as an outermost layer on the surface on the side of the M-surface or each side, thereby improving bonding strength.

The copper foil for TAB tape carriers of the present invention may be preferably produced by feeding a copper foil with a desired thickness and width from a coil at a constant speed through a copper foil-treating apparatus, which consists of a series of equipments including a degreasing tank, an acid rinsing tank, a water rinsing tank, a surface roughening treatment tank and a water rinsing tank, which are optionally used, a plating tank for forming the nickel-cobalt-molybdenum layer, a water rinsing tank, an optional chromate treatment tank, an optional silane coupling agent treatment tank and a drier, and then continuously winding up.

The TAB carrier tape of the present invention is produced by applying the thus obtained copper foil for TAB tape carriers of the present invention onto a flexible insulating film, with a surface on the side of the M-surface contacting the flexible insulating film. The preferred thickness of the flexible insulating film is generally 40 to 125 μm. The copper foil and the flexible insulating film may be bonded with adhesive, or by using a flexible insulating film coated with an adhesive.

The TAB tape carrier of the present invention is produced by etching the copper foil of the TAB carrier tape of the present invention to form a copper lead pattern. For example, a copper lead pattern may be produced by forming a photo resist layer of a desired pattern on the TAB carrier tape of the present invention, and carrying out etching by using the photo resist layer as a mask.

Even if the TAB tape carrier of the present invention is Sn plated on the surface of the copper leads when a semiconductor device is bonded by TAB technique, it prevents the generation of Sn whiskers and Kirkendall voids.

The present invention will be described in more detail with reference to the following Examples and Comparative Examples, which, however, do not limit the scope of the invention.

EXAMPLES 1 TO 4 AND COMPARATIVE EXAMPLES 1 TO 9

Example 1

A plating bath adjusted to pH 5.0 and 30° C. was prepared by dissolving 30 g/l of $NiSO_4 \cdot 6H_2O$, 8 g/l of $CoSO_4 \cdot 7H_2O$, 3 g/l of $Na_2MoO_4 \cdot 2H_2O$ and 30 g/l of trisodium citrate dihydrate. In the plating bath was dipped a 18 μm thick electrolytic copper foil the M-surface of which had been previously roughened (M-surface roughness Ra=0.55 µm, S-surface roughness Ra=0.2 µm, tensile strength=580 N/mm$^2$), and the S-surface of the copper foil was subjected to a cathodic electrolysis treatment at 1.0 A/dm$^2$ for an electrolyzing period of 3 seconds, to form a nickel-cobalt-molybdenum layer. Immediately after the cathodic electrolysis treatment, the copper foil was taken out from the plating bath, rinsed with water, and dried in a drier kept at 100° C. The coating amounts of the metals in the nickel-cobalt-molybdenum layer were 100 µg/dm$^2$ of nickel, 300 µg/dm$^2$ of cobalt and 100 µg/dm$^2$ of molybdenum, as measured as metals with an ICP (inductively coupled plasma luminescent) analyzer.

For the following characteristic tests, the obtained copper foil bearing the nickel-cobalt-molybdenum layer was bonded to a polyimide base material having an adhesive coating (a 75 µm thick polyimide film, adhesive: an epoxy adhesive), with the roughened surface contacting the substrate, heated at 160° C. for 6 hours to cure the adhesive, and cut into test pieces of 100 mm length and 70 mm width. The results of the following characteristic tests are listed in Table 1 and Table 2.

(1) Sn Whisker Test

After a test circuit having 250 lines of 30 µm in line width, 30 µm in line space and 1 mm in length was formed on a test piece by etching, the test piece was acid-rinsed with 10% sulfuric acid for 10 seconds, Sn plated to about 1 µm thick in an electroless Sn-plating bath at 70° C., rinsed with a hot water of 80° C., and dried. The test piece was then heated for 2 hours in a drier kept at 100° C., allowed to stand at room temperature for about one month, and observed for the existence of Sn whiskers on all of the 250 lines was observed with a metallurgical microscope of 500 magnification. Evaluations of the test results are as follows: ○: Less than 5 Sn whiskers of 5 µm or longer, Δ: 5 to 30 Sn whiskers, and X: 31 Sn whiskers or more.

(2) Kirkendall Void Test

After a test circuit having 15 lines of 50 µm in line width, 50 µm in line space and 1 mm in length was formed on each of two test pieces by etching, the test pieces were acid-rinsed with 10 % sulfuric acid for 10 seconds, Sn plated to about 1 µm thick in an electroless Sn plating bath at 70° C., rinsed with a hot water of 80° C., and dried. The test pieces were then heated for 2 hours in a drier kept at 125° C., taken out from the drier, and allowed to cool down to room temperature. Subsequently, one test piece was heated for 2 hours in a drier kept at 160° C., while another test piece was heated for 2 hours in a drier kept at 170° C. The test pieces were then buried in a burying resin, ground to observe sections, which were then observed with a 10000 magnification electron microscope for the generation of Kirkendall voids under 15 lines of 50 µm line width at the interface between the Sn layer and the Cu layer. Evaluations of the test results are as follows: ○: No Kirkendall voids, Δ: Having Kirkendall voids of less than 0.1 µm under some lines, and X: Having Kirkendall voids of 0.1 µm or more.

(3) Heat Resistance Test

The surface of the copper foil on a test piece was visually observed for discoloration just after lamination, after heating at 200° C. for 1 hour and after heating at 240° C. for 10 minutes. Evaluations of the test results are as follows: ○: No discoloration, Δ: Little discoloration, and X: Strong discoloration.

(4) Solder Wettability Test

A test piece was pretreated by chemically grinding the surface by 1 µm, and evaluated according to IPC-TM-650. 2. 4. 12.

Examples 2–4

A nickel-cobalt-molybdenum layer was formed on the same copper foil as used in Example 1 by using a plating bath and electrolysis conditions which are shown in Table 1, and water rinsing and drying were then carried out in the same manner as in Example 1. Test pieces were produced by using the copper foil obtained, and measurements of metal contents and tests for characteristics were carried out in the same manner as in Example 1. The results are listed in Tables 1 and 2.

Comparative Example 1

A nickel layer was formed on the same copper foil as used in Example 1 in the same manner as in Example 1, except the composition of the plating bath and the electrolysis conditions were changed as shown in Table 1, and water rinsing and drying were then carried out in the same manner as in Example 1. Test pieces were produced by using the copper foil obtained, and measurements of metal contents and tests for characteristics were carried out in the same manner as in Example 1. The results are listed in Tables 1 and 2.

Comparative Example 2

A cobalt layer was formed on the same copper foil as used in Example 1 in the same manner as in Example 1, except the composition of the plating bath and the electrolysis conditions were changed as shown in Table 1, and water rinsing and drying were then carried out in the same manner as in Example 1. Test pieces were produced by using the copper foil obtained, and measurements of metal contents and tests for characteristics were carried out in the same manner as in Example 1. The results are listed in Tables 1 and 2.

Comparative Example 3

A nickel-cobalt layer was formed on the same copper foil as used in Example 1 in the same manner as in Example 1, except the composition of the plating bath and the electrolysis conditions were changed as shown in Table 1, and water rinsing and drying were then carried out in the same manner as in Example 1. Test pieces were produced by using the copper foil obtained, and measurements of metal contents and tests for characteristics were carried out in the same manner as in Example 1. The results are listed in Tables 1 and 2.

Comparative Example 4

A cobalt-molybdenum layer was formed on the same copper foil as used in Example 1 in the same manner as in Example 1, except the composition of the plating bath and the electrolysis conditions were changed as shown in Table 1, and water rinsing and drying were then carried out in the same manner as in Example 1. Test pieces were produced by using the copper foil obtained, and measurements of metal contents and tests for characteristics were carried out in the same manner as in Example 1. The results are listed in Tables 1 and 2.

Comparative Example 5

A nickel-molybdenum layer was formed on the same copper foil as used in Example 1 in the same manner as in Example 1, except the composition of the plating bath and the electrolysis conditions were changed as shown in Table 1, and water rinsing and drying were then carried out in the same manner as in Example 1. Test pieces were produced by using the copper foil obtained, and measurements of metal contents and tests for characteristics were carried out in the same manner as in Example 1. The results are listed in Tables 1 and 2.

Comparative Example 6

A tin layer was formed on the same copper foil as used in Example 1 in the same manner as in Example 1, except the composition of the plating bath and the electrolysis conditions were changed as shown in Table 1, and water rinsing and drying were then carried out in the same manner as in Example 1. Test pieces were produced by using the copper foil obtained, and measurements of metal contents and tests for characteristics were carried out in the same manner as in Example 1. The results are listed in Tables 1 and 2.

Comparative Example 7

A tin-zinc layer was formed on the same copper foil as used in Example 1 in the same manner as in Example 1, except the composition of the plating bath and the electrolysis conditions were changed as shown in Table 1, and water rinsing and drying were then carried out in the same manner as in Example 1. Test pieces were produced by using the copper foil obtained, and measurements of metal contents and tests for characteristics were carried out in the same manner as in Example 1. The results are listed in Tables 1 and 2.

Comparative Example 8

An indium-zinc layer was formed on the same copper foil as used in Example 1 in the same manner as in Example 1, except the composition of the plating bath and the electrolysis conditions were changed as shown in Table 1, and water rinsing and drying were then carried out in the same manner as in Example 1. Test pieces were produced by using the copper foil obtained, and measurements of metal contents and tests for characteristics were carried out in the same manner as in Example 1. The results are listed in Tables 1 and 2.

Comparative Example 9

A chromium-zinc layer was formed on the same copper foil as used in Example 1 in the same manner as in Example 1, except the composition of the plating bath and the electrolysis conditions were changed as shown in Table 1, and water rinsing and drying were then carried out in the same manner as in Example 1. Test pieces were produced by using the copper foil obtained, and measurements of metal contents and tests for characteristics were carried out in the same manner as in Example 1. The results are listed in Tables 1 and 2.

The copper foils of Examples 1 to 4 having respective nickel-cobalt-molybdenum layers prevented the generation of Sn whiskers and Kirkendall voids and also exhibited good heat resistance and solder wettability by adjusting the coating amounts of the metals. The copper foil having the nickel layer formed in Comparative Example 1 prevented the generation of Sn whiskers, but could not prevent the generation of Kirkendall voids. The copper foil having the cobalt layer formed in Comparative Example 2 could not prevent the generation of Sn whiskers nor the generation of Kirkendall voids. The copper foil having the nickel-cobalt layer formed in Comparative Example 3 somewhat prevented the generation of Sn whiskers and Kirkendall voids, but could not prevent completely. The copper foil having the cobalt-molybdenum layer formed in Comparative Example 4 prevented the generation of Kirkendall voids, but could not prevent the generation of Sn whiskers. The copper foil having the nickel-molybdenum layer formed in Comparative Example 5 prevented the generation of Sn whiskers, but could not prevent the generation of Kirkendall voids. The copper foil having the tin layer formed in Comparative Example 6 could not prevent the generation of Kirkendall voids. The copper foil having the tin-zinc layer formed in Comparative Example 7 and the copper foil having the indium-zinc layer formed in Comparative Example 8 could not prevent the generation of Sn whiskers nor the generation of Kirkendall voids. The copper foil having the chromium-zinc layer formed in Comparative Example 9 could not prevent the generation of Sn whiskers, and could not prevent the generation of Kirkendall voids sufficiently.

The results show that the copper foils of the present invention having their respective nickel-cobalt-molybdenum layers were excellent in the results of the characteristic tests. It is presumed that the synergistic effects of nickel and cobalt and molybdenum contribute to the properties that are quite different from those of a layer of nickel or cobalt alone and layers of two components selected from nickel, cobalt and molybdenum, particularly to the prevention of the generation of both Sn whiskers and Kirkendall voids.

TABLE 1

| | Composition of plating bath: g/l | | Electrolysis conditions | | | Coating amount of metal: µg/dm² | | | | | | |
|---|---|---|---|---|---|---|---|---|---|---|---|---|
| | | pH | Temp. °C. | Current density A/dm² | Time sec | Co | Ni | Mo | Sn | Zn | In | Cr |
| Ex. Nos. | | | | | | | | | | | | |
| 1 | NiSO₄.6H₂O:30 CoSO₄.7H₂O:8 Na₂MoO₄.2H₂O:3 Na₃C₆H₅O₇.2H₂O:30 | 5.0 | 30 | 1.0 | 3 | 300 | 100 | 100 | — | — | — | — |
| 2 | NiSO₄.6H₂O:30 CoSO₄.7H₂O:8 Na₂MoO₄.2H₂O:3 Na₃C₆H₅O₇.2H₂O:30 | 5.0 | 30 | 1.5 | 4 | 220 | 370 | 150 | — | — | — | — |
| 3 | NiSO₄.6H₂O:30 CoSO₄.7H₂O:8 | 5.0 | 30 | 1.0 | 2 | 100 | 50 | 50 | — | — | — | — |

TABLE 1-continued

| | Composition of plating bath: g/l | | Electrolysis conditions | | | Coating amount of metal: μg/dm² | | | | | | |
|---|---|---|---|---|---|---|---|---|---|---|---|---|
| | | pH | Temp. °C. | Current density A/dm² | Time sec | Co | Ni | Mo | Sn | Zn | In | Cr |
| 4 | Na₂MoO₄.2H₂O:3<br>Na₃C₆H₅O₇.2H₂O:30<br>NiSO₄.6H₂O:30<br>CoSO₄.7H₂O:8<br>Na₂MoO₄.2H₂O:3<br>Na₃C₆H₅O₇.2H₂O:30 | 5.0 | 30 | 1.0 | 5 | 300 | 200 | 100 | — | — | — | — |
| Comp. Ex. Nos. | | | | | | | | | | | | |
| 1 | NiSO₄.6H₂O:280<br>H₃BO₃:40<br>Sodium saccharinate:2.0 | 4.0 | 30 | 0.6 | 3 | — | 100 | — | — | — | — | — |
| 2 | CoSO₄.7H₂O:9.3 | 4.6 | 30 | 0.4 | 3 | 250 | — | — | — | — | — | — |
| 3 | NiSO₄.6H₂O:30<br>CoSO₄.7H₂O:9.3<br>Na₂MoO₄.2H₂O:30 | 4.6 | 30 | 1.0 | 3 | 400 | 100 | — | — | — | — | — |
| 4 | CoSO₄.7H₂O:9.3<br>Na₂MoO₄.2H₂O:3<br>Na₃C₆H₅O₇.2H₂O:5 | 4.6 | 30 | 0.6 | 3 | 230 | — | 50 | — | — | — | — |
| 5 | NiSO₄.6H₂O:30<br>Na₂MoO₄.2H₂O:3<br>Na₃C₆H₅O₇.2H₂O:30 | 4.6 | 30 | 0.6 | 3 | — | 130 | 50 | — | — | — | — |
| 6 | SnSO₄:1.0<br>Na₃C₆H₅O₇.2H₂O:20<br>(NH₄)₂SO₄:10 | 6.2 | 30 | 0.7 | 4 | — | — | — | 350 | — | — | — |
| 7 | SnSO₄:1.0<br>ZnSO₄.7H₂O:2.0<br>Na₃C₆H₅O₇.2H₂O:20<br>(NH₄)₂SO₄:10 | 6.2 | 30 | 0.7 | 4 | — | — | — | 300 | 100 | — | — |
| 8 | In₂(SO₄)₃:0.5<br>ZnSO₄.7H₂O:5.0 | 3.0 | 30 | 0.8 | 3 | — | — | — | — | 170 | 90 | — |
| 9 | Na₂Cr₂O₇.2H₂O:2.0<br>ZnSO₄.7H₂O:1.0 | 4.3 | 30 | 0.2 | 4 | — | — | — | — | 30 | — | 20 |

TABLE 2

| | Example Nos. | | | | Comparative Example Nos. | | | | | | | | |
|---|---|---|---|---|---|---|---|---|---|---|---|---|---|
| | 1 | 2 | 3 | 4 | 1 | 2 | 3 | 4 | 5 | 6 | 7 | 8 | 9 |
| Layer formed (μg/dm²) | Ni—Co—Mo | Ni—Co—Mo | Ni—Co—Mo | Ni—Co—Mo | Ni | Co | Ni—Co | Co—Mo | Ni—Mo | Sn | Sn—Zn | In—Zn | Cr—Zn |
| Co | 300 | 220 | 100 | 300 | — | 250 | 400 | 230 | — | — | — | — | — |
| Ni | 100 | 370 | 50 | 200 | 100 | — | 100 | — | 130 | — | — | — | — |
| Mo | 100 | 150 | 50 | 100 | — | — | — | 50 | 50 | — | — | — | — |
| Sn | — | — | — | — | — | — | — | — | — | 350 | 300 | — | — |
| Zn | — | — | — | — | — | — | — | — | — | — | 100 | 170 | 30 |
| In | — | — | — | — | — | — | — | — | — | — | — | 90 | — |
| Cr | — | — | — | — | — | — | — | — | — | — | — | — | 20 |
| Characteristics | | | | | | | | | | | | | |
| Sn whisker Kirkendall void | ○ | ○ | ○ | ○ | ○ | X | X | X | ○ | ○ | X | X | X |
| 160° C. | ○ | ○ | ○ | ○ | X | X | X | ○ | X | X | X | X | Δ |
| 170° C. | ○ | ○ | ○ | ○ | X | X | X | ○ | X | X | X | X | X |
| Heat resistance | | | | | | | | | | | | | |
| 200° C. | ○ | ○ | ○ | ○ | Δ | Δ | ○ | ○ | ○ | ○ | ○ | ○ | Δ |
| 240° C. | ○ | ○ | ○ | ○ | Δ | Δ | ○ | Δ | Δ | ○ | ○ | ○ | Δ |
| Solder wettability | ○ | ○ | ○ | ○ | X | Δ | ○ | ○ | Δ | ○ | ○ | ○ | ○ |

The copper foil for TAB tape carriers of the present invention and the TAB carrier tape and TAB tape carrier both using the copper foil are remarkably effective in preventing both the generation of Sn whiskers and the generation of Kirkendall voids. The copper foil for TAB tape carriers of the present invention is also excellent in the characteristics necessary for formation of copper leads, including heat resistance and solder wettability. Further, having effects of preventing both the generation of Sn whiskers and the generation of Kirkendall voids, the copper foil is industrially invaluable because it necessitates no changes nor increase in the subsequent steps for forming copper leads.

What is claimed is:

1. A TAB carrier tape, consisting essentially of a flexible insulating film and a copper foil for a TAB tape carrier applied onto the flexible insulating film, wherein the copper foil for a TAB tape carrier comprises (a) a copper foil having a shiny surface and a mat surface and (b) either (i) an alloy layer comprising nickel, cobalt and molybdenum formed on the shiny surface or (ii) an alloy layer comprising nickel, cobalt and molybdenum formed on both the shiny surface and the mat surface, and wherein the mat surface faces the flexible insulating film.

2. The TAB carrier tape of claim 1, wherein the copper foil for a TAB tape carrier has an alloy layer comprising nickel, cobalt and molybdenum formed on the shiny surface and has a chromate treatment layer on the alloy layer.

3. The TAB carrier tape of claim 1, wherein the copper foil for a TAB tape carrier has the alloy layer comprising nickel, cobalt and molybdenum on each of the shiny surface and the mat surface, and has a chromate treatment layer on at least one of the alloy layers.

4. The TAB carrier tape of claim 1, wherein the copper foil for a TAB tape carrier has a surface roughening treatment layer on the mat surface.

5. The TAB carrier tape of claim 3, wherein the copper foil for a TAB tape carrier has a surface roughening treatment layer between the mat surface and the alloy layer formed on the mat surface.

6. The TAB carrier tape as claimed in any one of claims 1 to 5, wherein the copper foil for a TAB tape carrier has a silane coupling agent treatment layer as an outermost layer on at least one side of the copper foil for a TAB tape carrier.

7. A TAB tape carrier, which is produced from the TAB carrier tape of claim 1 by etching the copper foil for a TAB tape carrier to form a copper lead pattern.

8. The TAB tape carrier of claim 7, wherein the copper foil for a TAB tape carrier has an alloy layer comprising nickel, cobalt and molybdenum formed on the shiny surface and has a chromate treatment layer on the alloy layer.

9. The TAB tape carrier of claim 7, wherein the copper foil for a TAB tape carrier has the alloy layer comprising nickel, cobalt and molybdenum on each of the shiny surface and the mat surface, and has a chromate treatment layer on at least one of the alloy layers.

10. The TAB tape carrier of claim 7, wherein the copper foil for a TAB tape carrier has a surface roughening treatment layer on the mat surface.

11. The TAB tape carrier of claim 9, wherein the copper foil for a TAB tape carrier has a surface roughening treatment layer between the mat surface and the alloy layer formed on the mat surface.

12. The TAB tape carrier as claimed in any one of claims 7 to 11, wherein the copper foil for a TAB tape carrier has a silane coupling agent treatment layer as an outermost layer on at least one side of the copper foil for a TAB tape carrier.

* * * * *